US012772666B2

(12) United States Patent
Nakanishi

(10) Patent No.: US 12,772,666 B2
(45) Date of Patent: Oct. 20, 2026

(54) DISPLAY DEVICE AND METHOD FOR MANUFACTURING DISPLAY DEVICE

(71) Applicant: Sharp Display Technology Corporation, Kameyama City (JP)

(72) Inventor: Youhei Nakanishi, Kameyama City (JP)

(73) Assignee: Sharp Display Technology Corporation, Kameyama City (JP)

( * ) Notice: Subject to any disclaimer, the term of this patent is extended or adjusted under 35 U.S.C. 154(b) by 391 days.

(21) Appl. No.: 18/287,927

(22) PCT Filed: May 28, 2021

(86) PCT No.: PCT/JP2021/020397
§ 371 (c)(1),
(2) Date: Oct. 23, 2023

(87) PCT Pub. No.: WO2022/249447
PCT Pub. Date: Dec. 1, 2022

(65) Prior Publication Data
US 2024/0206235 A1 Jun. 20, 2024

(51) Int. Cl.
*H10K 59/122* (2023.01)
*H10K 59/35* (2023.01)
*H10K 59/80* (2023.01)

(52) U.S. Cl.
CPC ........... *H10K 59/122* (2023.02); *H10K 59/35* (2023.02); *H10K 59/876* (2023.02)

(58) Field of Classification Search
CPC ............................. H10K 59/122; H10K 59/35
USPC .................................................. 313/498–512
See application file for complete search history.

(56) References Cited

U.S. PATENT DOCUMENTS

| | | | | |
|---|---|---|---|---|
| 2002/0064966 A1 | 5/2002 | Seki et al. | | |
| 2004/0166761 A1 | 8/2004 | Seki et al. | | |
| 2005/0264186 A1 | 12/2005 | Seki et al. | | |
| 2005/0264187 A1 | 12/2005 | Seki et al. | | |
| 2005/0266169 A1 | 12/2005 | Seki et al. | | |
| 2007/0018152 A1 | 1/2007 | Seki et al. | | |
| 2008/0315760 A1 | 12/2008 | Seki et al. | | |
| 2009/0009075 A1 | 1/2009 | Seki et al. | | |
| 2009/0302333 A1 | 12/2009 | Seki et al. | | |
| 2013/0248834 A1 | 9/2013 | Seki et al. | | |
| 2014/0225095 A1 | 8/2014 | Seki et al. | | |
| 2021/0050389 A1* | 2/2021 | Yang | H10K 59/121 | |
| 2021/0098540 A1* | 4/2021 | Chen | H10K 59/352 | |
| 2021/0305330 A1* | 9/2021 | Xu | H10K 59/353 | |
| 2021/0359031 A1* | 11/2021 | Zheng | H10K 59/121 | |
| 2022/0037426 A1* | 2/2022 | Huang | H10K 59/35 | |
| 2024/0057456 A1* | 2/2024 | Chen | H10K 59/879 | |
| 2024/0122030 A1* | 4/2024 | Bae | G06V 40/1318 | |

FOREIGN PATENT DOCUMENTS

JP 2002-222695 A 8/2002

* cited by examiner

*Primary Examiner* — Christopher M Raabe
(74) *Attorney, Agent, or Firm* — ScienBiziP, P.C.

(57) ABSTRACT

A display device comprises a bank in which a plurality of holes are formed; and a plurality of light-emitting layers formed in the plurality of holes, wherein, among the plurality of light-emitting layers, a light-emitting layer, which is provided closer to a position in which the plurality of holes are low in density, exhibits a greater emission wavelength.

3 Claims, 9 Drawing Sheets

DISPLAY DEVICE AND METHOD FOR MANUFACTURING DISPLAY DEVICE

TECHNICAL FIELD

The disclosure relates to a display device and a method for manufacturing the display device.

BACKGROUND ART

A known method for manufacturing display devices uses coating or evaporation to form a plurality of light-emitting layers in a plurality of holes formed in banks.

CITATION LIST

Patent Literature

[Patent Document 1] Japanese Unexamined Patent Application Publication No. 2002-222695

SUMMARY

Technical Problems

Typically, the plurality of holes are densely packed in a single pixel; whereas, those holes are spaced apart from one another between different pixels. When the plurality of light-emitting layers are formed in the plurality of holes by coating or evaporation, the light-emitting layers formed by the coating might be nonuniform in thickness.

That is, because of low density of the plurality of holes, a light-emitting layer is relatively thick if formed in a hole positioned in, for example, an end portion of a pixel. Meanwhile, because of high density of the plurality of holes, a light-emitting layer is relatively thin if formed in a hole positioned in, for example, a center of a pixel.

The nonuniformity in thickness among the plurality of light-emitting layers is caused probably because the coffee ring effect, which is observed when a light-emitting material put in the plurality of holes dries, creates imbalance of a solute contained in the light-emitting material.

As to the display device, an effect of microcavity can improve light-emission efficiency of each of the plurality of light-emitting layers. However, because of the nonuniformity in thickness among the plurality of light-emitting layers, the display device cannot sufficiently obtain the effect of microcavity. As a result, the display device suffers low light-emission efficiency.

Solution to Problems

A display device according to an aspect of the disclosure includes: a bank in which a plurality of holes are formed; and a plurality of light-emitting layers formed in the plurality of holes. Among the plurality of light-emitting layers, a light-emitting layer, which is provided closer to a position in which the plurality of holes are low in density, exhibits a greater emission wavelength.

A method for method for manufacturing a display device according to a first aspect of the disclosure includes: a first step of forming a bank in which a plurality of holes are formed; and a second step of forming a plurality of light-emitting layers in the plurality of holes by coating. At the second step, a light-emitting layer, which is provided closer to a position in which the plurality of holes are lower in density, exhibits a greater emission wavelength.

Advantageous Effect

An aspect of the disclosure can provide a display device with high light emission efficiency.

DESCRIPTION OF EMBODIMENTS

Embodiments of the disclosure will be described below. For convenience in description, like reference signs designate members having identical functions throughout the Description. These members might not be elaborated upon repeatedly.

Figure 1:
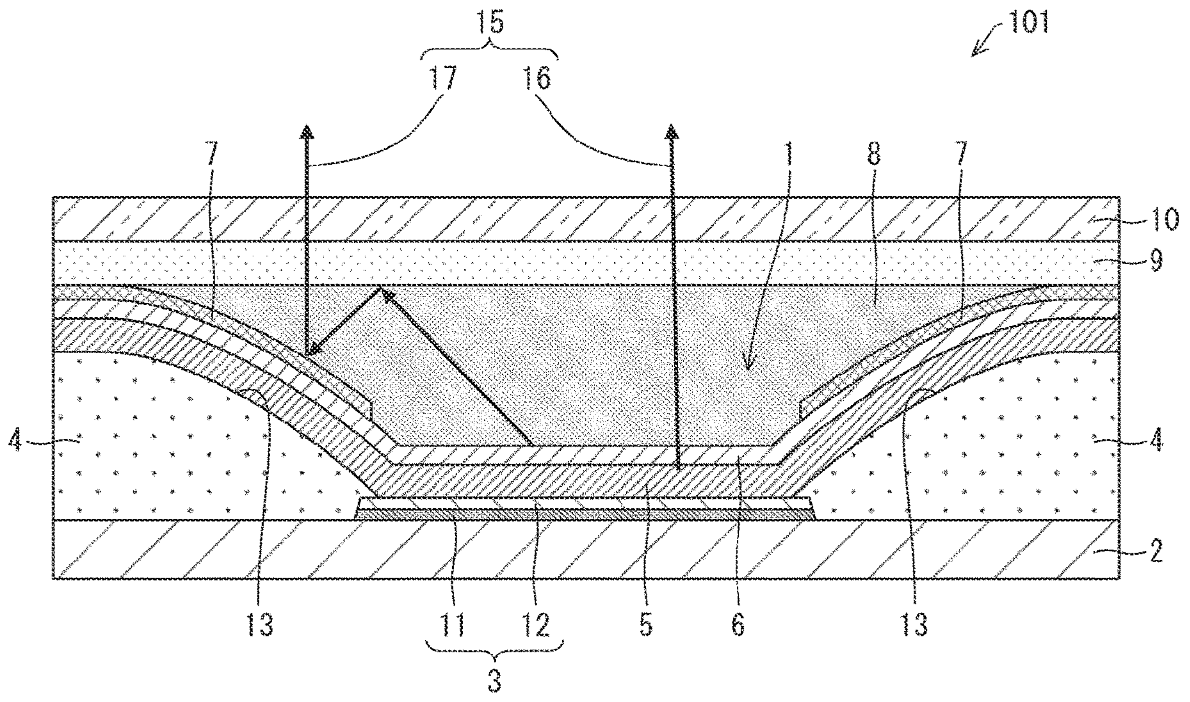
FIG. 1 illustrates a cross-sectional view of a light-emitting structure according to an embodiment of the disclosure.
Figure 2:
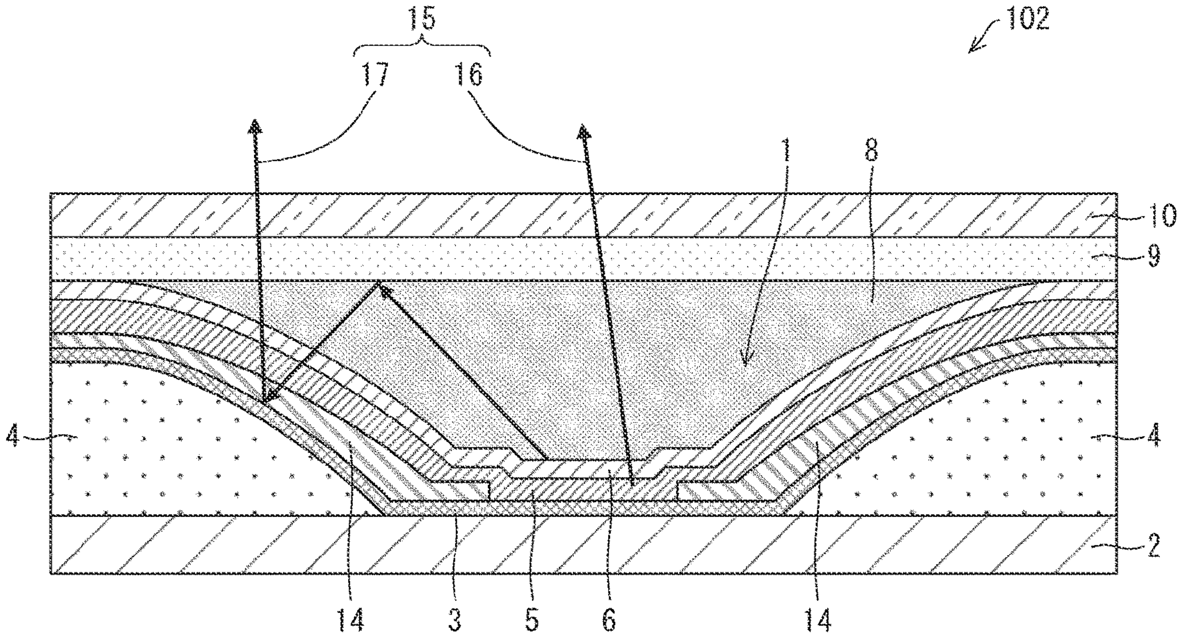
FIG. 2 illustrates a cross-sectional view of another light-emitting structure according to an embodiment of the disclosure.

FIG. 1 illustrates a cross-sectional view of a light-emitting structure 101 according to an embodiment of the disclosure. FIG. 2 illustrates a cross-sectional view of a light-emitting structure 102 according to an embodiment of the disclosure. Each of the light-emitting structures 101 and 102 is an example of a structure in which a light-emitting layer is formed in a hole 1. Hereinafter, terms such as “above” and "upwards" correspond to an upper side of each of FIGS. 1 and 2. Hereinafter, terms such as "below" and "downwards" correspond to a lower side of each of FIGS. 1 and 2.

The light-emitting structure 101 illustrated in FIG. 1 includes: a TFT substrate 2; an anode electrode 3; a bank 4; an EL layer 5; a cathode electrode 6; a reflective layer 7; a high refractive index material 8; a low refractive index material 9; and a cover glass 10.

The TFT substrate 2 is a substrate including a thin-film transistor (TFT).

The anode electrode 3 is electrically connected to the TFT of the TFT substrate 2. As illustrated in FIG. 1, the anode electrode 3 may include: a reflective conductive layer 11; and a light-transparent conductive layer 12. The reflective conductive layer 11 and the light-transparent conductive layer 12 are stacked in the stated order from toward the TFT substrate 2. An exemplary material of the reflective conductive layer 11 is aluminum. An exemplary material of the light-transparent conductive layer 12 is indium tin oxide (ITO).

The bank 4 is provided outside the anode electrode 3. As illustrated in FIG. 1, the bank 4 may cover an end portion of the anode electrode 3. The bank 4 forms the hole 1 above the anode electrode 3. The bank 4 has a side surface 13 angled with respect to a vertical direction, so that a diameter of the hole 1 viewed from above becomes larger from below upward. When viewed from above, a maximum diameter of the hole 1 is, for example, 10 μm or more and 20 μm or less.

The EL layer 5 is provided over and across the anode electrode 3 and the bank 4. The EL layer 5 includes: a hole injection layer; a hole transport layer; an electroluminescence layer; and an electron transport layer, all of which are stacked on top of another in the stated order from below. The hole injection layer is a layer into which holes from the anode electrode 3 are injected. The hole transport layer is a layer that transports the holes to the electroluminescence layer. The electron transport layer is a layer that transports electrons from the cathode electrode 6 to the electroluminescence layer. Between the electron transport layer and the cathode electrode 6, an electron injection layer may be provided. The electrons from the cathode electrode 6 may be injected into the electron injection layer, and the electron transport layer may transport the electrons to the electroluminescence layer.

The cathode electrode 6 is provided on the EL layer 5. Exemplary materials of the cathode electrode 6 include ITO and indium zinc oxide (IZO).

In the EL layer 5, the electroluminescence layer emits light by a current flowing between the anode electrode 3 and the cathode electrode 6. Examples of the electroluminescence layer include organic light-emitting diodes (OLEDs) and quantum-dot light-emitting diodes (QD-LEDs).

The reflective layer 7 is a light-reflective layer provided on the cathode electrode 6. Note that the reflective layer 7 is not provided on a portion, of the cathode electrode 6, immediately above the anode electrode 3.

The high refractive index material 8 is provided in, and fills, the hole 1. The low refractive index material 9 is provided over and across the high refractive index material 8 and the reflective layer 7. The cover glass 10 is provided on the low refractive index material 9. The cover glass has a thickness of, for example, 0.5 mm.

The light-emitting structure 102 illustrated in FIG. 2 includes: the TFT substrate 2; the bank 4; the anode electrode 3; an insulating layer 14; the EL layer 5; the cathode electrode 6; the high refractive index material 8; the low refractive index material 9; and the cover glass 10.

The anode electrode 3 is provided over and across the TFT substrate 2 and the bank 4. The insulating layer 14 is provided on the anode electrode 3. Note that the insulating layer 14 is not provided on a portion, of the anode electrode 3, not immediately above the bank 4. The EL layer 5 is provided over and across the insulating layer 14 and the portion, of the anode electrode 3, without the insulating layer 14. The cathode electrode 6 is provided on the EL layer 5.

The high refractive index material 8 is provided in, and fills, the hole 1. The low refractive index material 9 is provided over and across the high refractive index material 8 and the cathode electrode 6. The cover glass 10 is provided on the low refractive index material 9.

Each of the light-emitting structures 101 and 102 takes advantage of the microcavity effect to be described below to improve efficiency in releasing light emitted from the electroluminescence layer of the EL layer 5.

On the cathode electrode 6, the high refractive index material 8 is provided, and, over the high refractive index material 8, the low refractive index material 9 is provided. The high refractive index material 8 receives light from the cathode electrode 6, and releases the light.

Light 15 incident on the high refractive index material 8 includes: a light ray 16 passing through the low refractive index material 9; and a light ray 17 totally reflected on the low refractive index material 9. The light ray 17 is totally reflected on the low refractive index material 9. After that, the light ray 17 is further reflected on a portion included in a light-reflective layer (the reflective layer 7 in the light-emitting structure 101, and the anode electrode 3 in the light-emitting structure 102) and positioned above the side surface 13. When the light ray 17 is reflected once or more on the low refractive index material 9 and the light-reflective layer, the light ray 17 can finally pass through the low refractive index material 9.

Note that, the light-emitting structure in the description below is assumed as the light-emitting structure 101. However, the light-emitting structure 102 may be used instead of the light-emitting structure 101.

Figure 3:
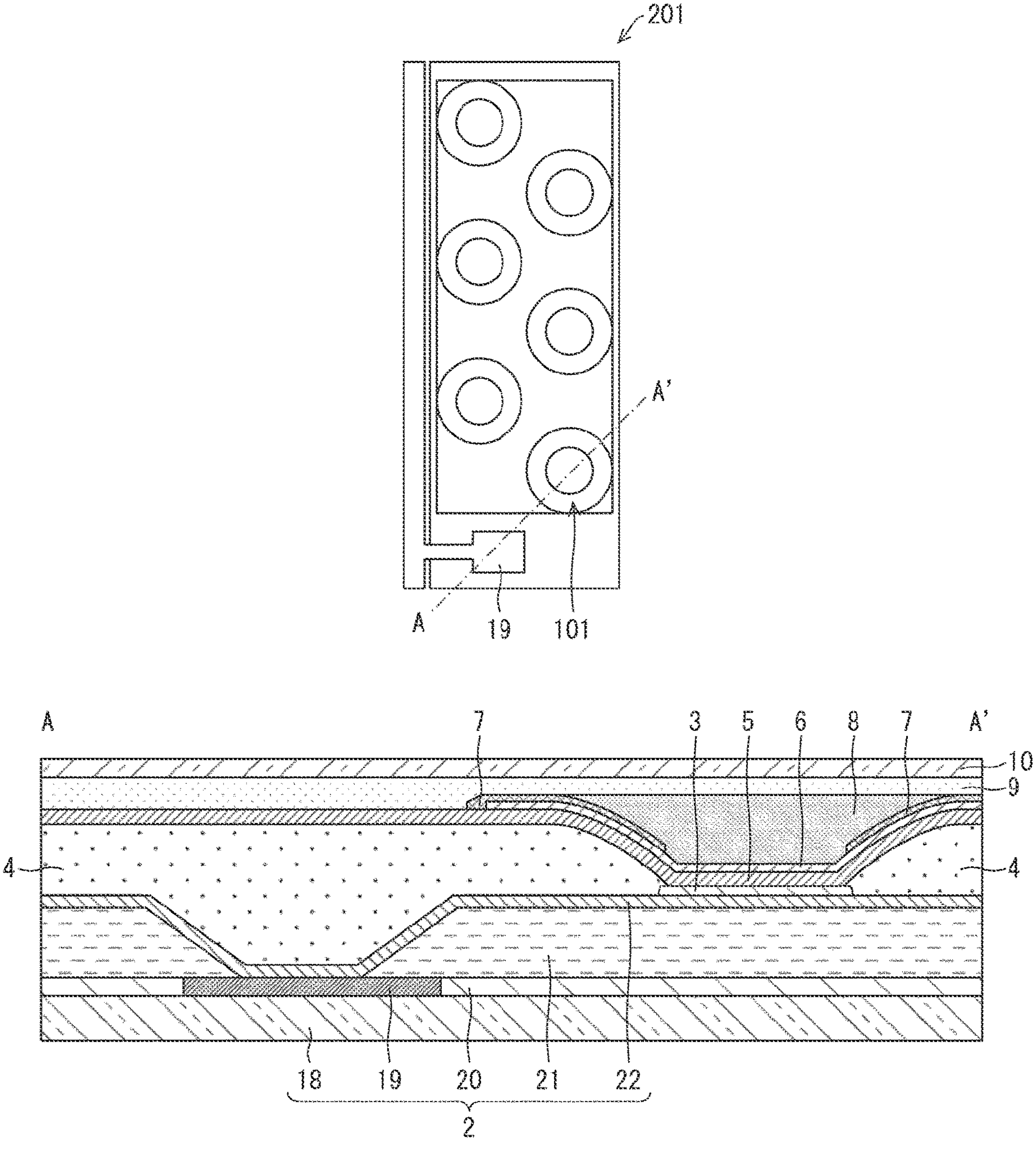
FIG. 3 illustrates a schematic plan view and a cross-sectional view of a display device according to an embodiment of the disclosure. The cross-sectional view is taken along line A-A'.

FIG. 3 illustrates a schematic plan view and a cross-sectional view of a display device 201 according to an embodiment of the disclosure. The cross-sectional view is taken along line A-A'. The light-emitting structure 101 is provided for each of the pixels of the display device 201. Two or more light-emitting structures 101 share one TFT substrate 2. The TFT substrate 2 includes: a glass base substrate 18; a TFT drain 19; an insulating layer 20; a planarization layer 21; and an electrode 22.

The TFT drain 19 is a drain of a TFT of the TFT substrate 2, and is provided on the glass base substrate 18. The insulating layer 20 is provided on the glass base substrate 18 around the TFT drain 19. The planarization layer 21 is provided on the insulating layer 20. As illustrated in FIG. 3, the planarization layer 21 may cover an end portion of the TFT drain 19. The electrode 22 is provided over and across the TFT drain 19 and the planarization layer 21. The electrode 22 electrically connects together the TFT drain 19 and the anode electrode 3. The bank 4 is provided on the electrode 22.

Figure 4:
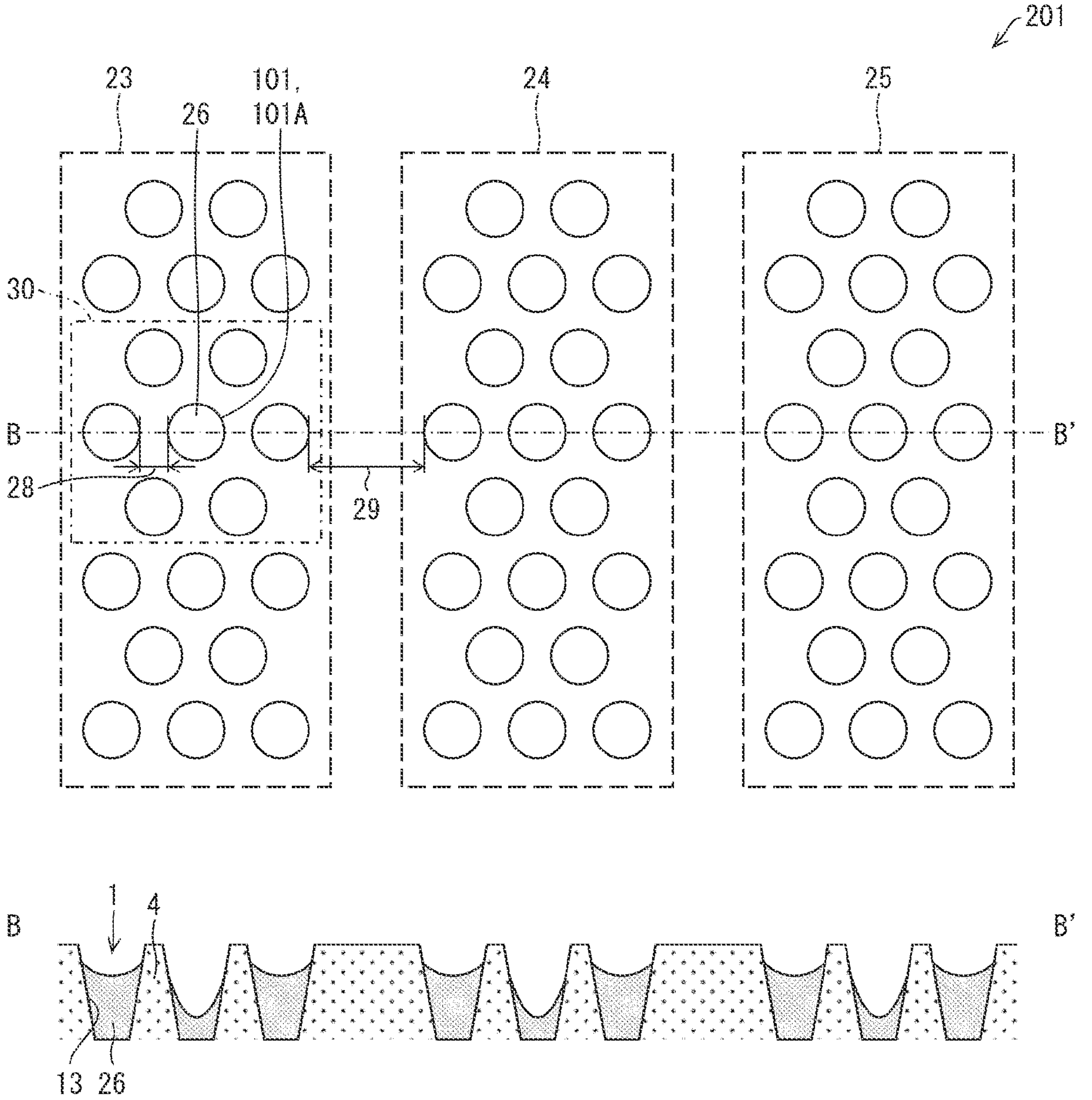
FIG. 4 illustrates another schematic plan view and another cross-sectional view of the display device according to the embodiment of the disclosure. The cross-sectional view is taken along line B-B'.
Figure 5:
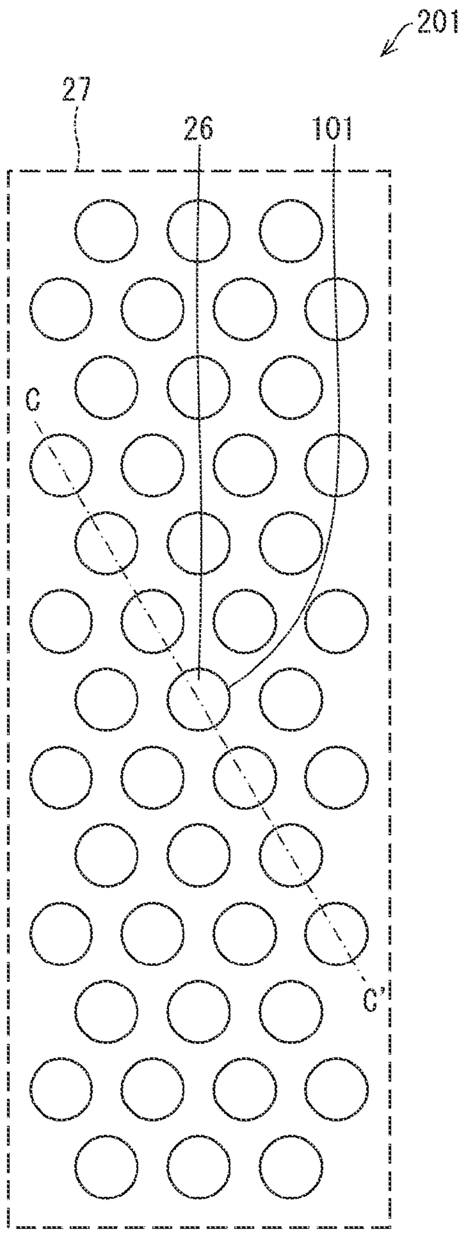
FIG. 5 illustrates still another schematic plan view and still another cross-sectional view of the display device according to the embodiment of the disclosure. The cross-sectional view is taken along line C-C'.
Figure 5:
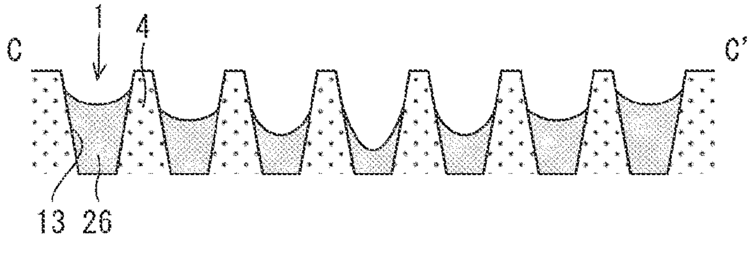

FIG. 4 illustrates another schematic plan view and another cross-sectional view of the display device 201 according to the embodiment of the disclosure. The cross-sectional view is taken along line B-B'. FIG. 5 illustrates still another schematic plan view and still another cross-sectional view of the display device 201 according to the embodiment of the disclosure. The cross-sectional view is taken along line C-C'.

The schematic plan view in FIG. 4 illustrates an exemplary arrangement of the light-emitting structures 101 included in each of pixels 23 to 25. The schematic plan view in FIG. 5 illustrates an exemplary arrangement of the plurality of light-emitting structures 101 included in a pixel 27. Each of the cross-sectional view taken along line B-B' in FIG. 4 and the cross-sectional view taken along line C-C' in FIG. 5 shows a positional relationship between the bank 4, a plurality of the holes 1, and a plurality of light-emitting layer 26 formed in the plurality of holes 1. Each of the light-emitting layer 26 is a single layer or a multilayer formed in one of the holes 1 by coating or evaporation. The light-emitting layer 26 includes at least the electroluminescence layer of the EL layer 5. The light-emitting layer 26 may include the EL layer 5 alone, or may include the anode electrode 3 and/or the cathode electrode 6 in addition to the EL layer 5. That is, for example, the light-transparent conductive layer 12 of the anode electrode 3 may be formed by application and firing of an applicable ITO. For simplicity of illustration and description, FIGS. 4 and 5 omit members in the holes 1 other than the light-emitting layers 26.

As illustrated in FIG. 4, in the display device 201, a clearance 28 between adjacent two of the light-emitting structures 101 provided in the pixel 23 is smaller than a clearance 29 between adjacent two of the adjacent light-emitting structures 101 each provided in one of the pixel 23 and the pixel 24. Note that a clearance between the two light-emitting structures 101 corresponds to a length of a line segment connecting the holes 1 of the two light-emitting structures 101 in the shortest distance.

When the light-emitting layers 26 to be provided in the holes 1 are formed by coating with a spin coater or a slit coater, or by evaporation, the light-emitting layers 26 formed by coating are nonuniform in thickness because of the coffee ring effect. The nonuniformity in thickness is observed when a light-emitting material of the light-emitting layers 26 dries. As to a single light-emitting structure 101, as illustrated in FIGS. 4 and 5, the light-emitting layer 26 is thicker as closer to the side surface 13 of the bank 4. As to the plurality of light-emitting structures 101, as illustrated in FIGS. 4 and 5, the light-emitting layer 26 is thicker as the density of the holes 1 with respect to the light-emitting structures 101 is lower. When one of the light-emitting structures 101 is referred to as a light-emitting structure 101A, the density of the holes 1 with respect to the light-emitting structure 101A is defined by the number of the holes 1 of the light-emitting structures 101 found in a unit area 30 with the light-emitting structure 101A positioned in the center.

If the plurality of light-emitting layers 26 are nonuniform in thickness, a light-emitting structure 101, whose light-emitting layer 26 has accidentally varied, cannot sufficiently obtain the microcavity effect. As a result, the display device 201 suffers low light-emission efficiency. Furthermore, if the plurality of light-emitting layers 26 are nonuniform in thickness, each of the pixels 23 to 25 and 27 varies in electro-optic characteristic. The variation might deteriorate performance of the display device 201. Examples of deterioration in the performance of the display device 201 include: a rise of drive voltage, an increase in power consumption, and a decrease in the life of the light-emitting structure 101 because of an increase in current density.

First Embodiment

Figure 6:
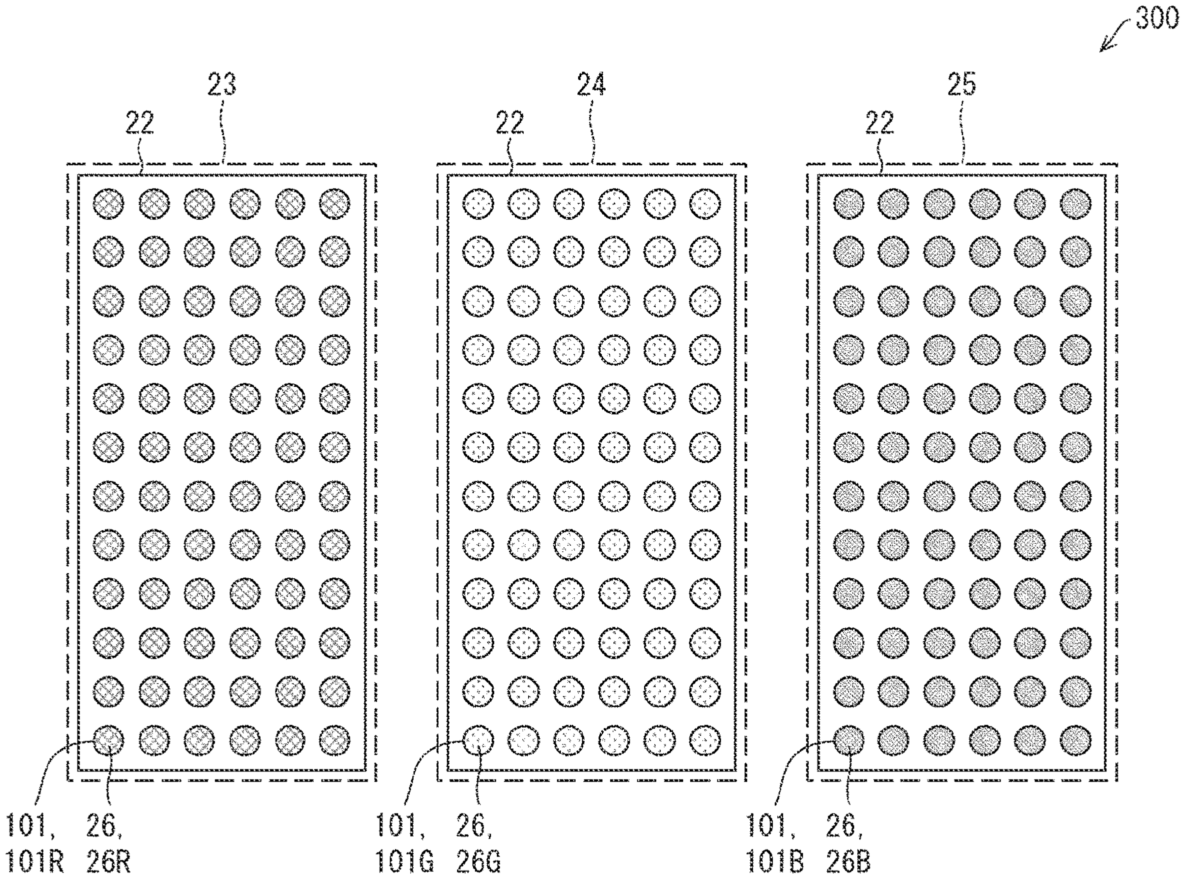
FIG. 6 illustrates a schematic plan view of how a plurality of light-emitting structures are arranged in a display device according to a comparative example.
Figure 7:
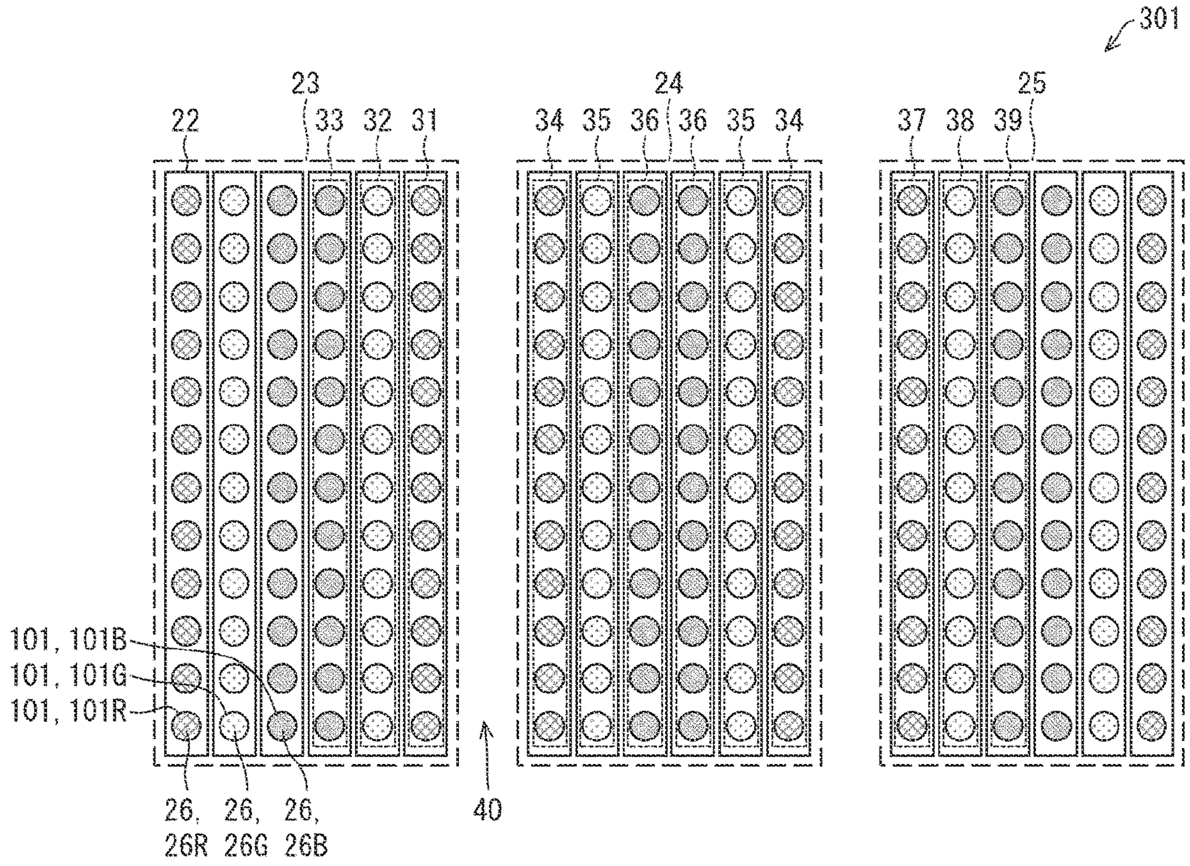
FIG. 7 illustrates a schematic plan view of how a plurality of light-emitting structures are arranged in a display device according to a first embodiment.

FIG. 6 illustrates a schematic plan view of how the plurality of light-emitting structures 101 are arranged in a display device 300 according to a comparative example. FIG. 7 illustrates a schematic plan view of how the plurality of light-emitting structures 101 are arranged in a display device 301 according to a first embodiment of the disclosure. FIGS. 6 and 7 also illustrate positions of the electrodes 22.

As illustrated in FIGS. 6 and 7, in plan view, the pixels 23 to 25 of the display devices 300 and 301 are the same in configuration as the pixels 23 to 25 of the display device 201 except that the light-emitting structures 101 are changed from a staggered arrangement to a matrix arrangement.

The plurality of light-emitting structures 101 are classified into light-emitting structures 101R each having a red light-emitting layer 26R, light-emitting structures 101G each having a green light-emitting layer 26G, and light-emitting structures 101B each having a blue light-emitting layer 26B. The red light-emitting layer 26R is the light-emitting layer 26, and emits a red light. The green light-emitting layer 26G is the light-emitting layer 26, and emits a green light. The blue light-emitting layer 26B is the light-emitting layer 26, and emits a blue light.

In the display device 300, all of the light-emitting structures 101 included in the pixel 23 are the light-emitting structures 101R. In the display device 300, all of the light-emitting structures 101 included in the pixel 24 are the light-emitting structures 101G. In the display device 300, all of the light-emitting structures 101 included in the pixel 25 are the light-emitting structures 101B.

Meanwhile, as to the display device 301, a positional relationship between the light-emitting structures 101R, 101G, and 101B in each of the pixels 23 to 25 is determined as follows.

In the display device 301, among the light-emitting structures 101 included in the pixel 23, light-emitting structures 101 included in a column 31 closest to the pixel 24 are all light-emitting structures 101R. In the display device 301, among the light-emitting structures 101 included in the pixel 23, light-emitting structures 101 included in a column 32 closest to the pixel 24 next to the column 31 are all light-emitting structures 101G. In the display device 301, among the light-emitting structures 101 included in the pixel 23, light-emitting structures 101 included in a column 33 closest to the pixel 24 next to the column 32 are all light-emitting structures 101B.

In the display device 301, among the light-emitting structures 101 included in the pixel 24, light-emitting structures 101 included in a column 34 closest to either the pixel 23 or the pixel 25 are all light-emitting structures 101R. In the display device 301, among the light-emitting structures 101 included in the pixel 24, light-emitting structures 101 included in a column 35 closest to either the pixel 23 or the pixel 25 next to the column 34 are all light-emitting structures 101G. In the display device 301, among the light-emitting structures 101 included in the pixel 24, light-emitting structures 101 included in a column 36 closest to either the pixel 23 or the pixel 25 next to the column 35 are all light-emitting structures 101B.

In the display device 301, among the light-emitting structures 101 included in the pixel 25, light-emitting structures 101 included in a column 37 closest to the pixel 24 are all light-emitting structures 101R. In the display device 301, among the light-emitting structures 101 included in the pixel 25, light-emitting structures 101 included in a column 38 closest to the pixel 24 next to the column 37 are all light-emitting structures 101G. In the display device 301, among the light-emitting structures 101 included in the pixel 25, light-emitting structures 101 included in a column 39 closest to the pixel 24 next to the column 38 are all light-emitting structures 101B.

The density of holes 1 with respect to the light-emitting structures 101R that belong to the column 34 is lower than the density of holes 1 with respect to the light-emitting structures 101G that belong to the column 35. The density of the holes 1 with respect to the light-emitting structures 101G that belongs to the column 35 is lower than the density of holes 1 with respect to the light-emitting structures 101B that belongs to the column 36. Hence, according to the configuration of the pixel 24, the density of the holes 1 with respect to the corresponding light-emitting structures 101 is lower in the order of the red light-emitting layers 26R, the green light-emitting layers 26G, and the blue light-emitting layers 26B. The red light-emitting layers 26R, the green light-emitting layers 26G, and the blue light-emitting layers 26B in each of the pixels 23 and 25 are also arranged in the same manner as those in the pixel 24. That is, in the display device 301, among the plurality of light-emitting layers 26, a light-emitting layer 26, which is provided closer to a position in which the plurality of holes 1 are low in density, exhibits a greater emission wavelength.

Hence, a light-emitting layer 26 having a greater wavelength tends to be formed thicker, and each light-emitting layer 26 can easily and sufficiently obtain the microcavity effect. Such a feature allows the display device 301 to have the light-emitting layers 26 with high light-emission efficiency.

Furthermore, the display device 301 is divided into three (multiple) groups of the pixels 23 to 25. The bank 4 includes a first clearance portion 40 separating adjacent two of the pixels 23 to 25 from each other. Here, the first clearance portion 40 separates the pixels 23 and 24 from each other. Among the plurality of light-emitting layers 26, red light-emitting layers 26R are adjacent to the first clearance portion 40.

In the display device 300, one electrode 22 is provided for each of the pixels 23 to 25. Meanwhile, in the display device 301, one electrode 22 is provided for each of the columns 31 to 39.

In the display device 301, when the red light-emitting layers 26R are designated as marked light-emitting layers, the red light-emitting layers 26R are arranged in a column as, for example, the column 31. The display device 301 includes the electrode 22 common to the plurality of red light-emitting layers 26R that belong to the same column 31.

Second Embodiment

Figure 8:
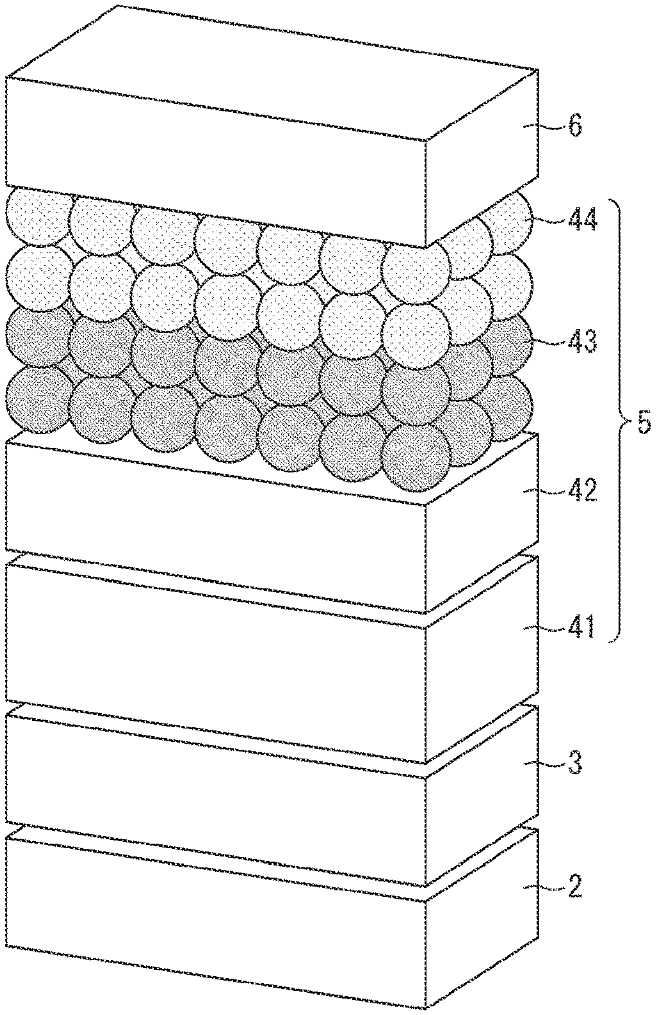
FIG. 8 illustrates a conceptual diagram illustrating a TFT substrate, an anode electrode, an EL layer, and a cathode electrode in a light-emitting structure.
Figure 9:
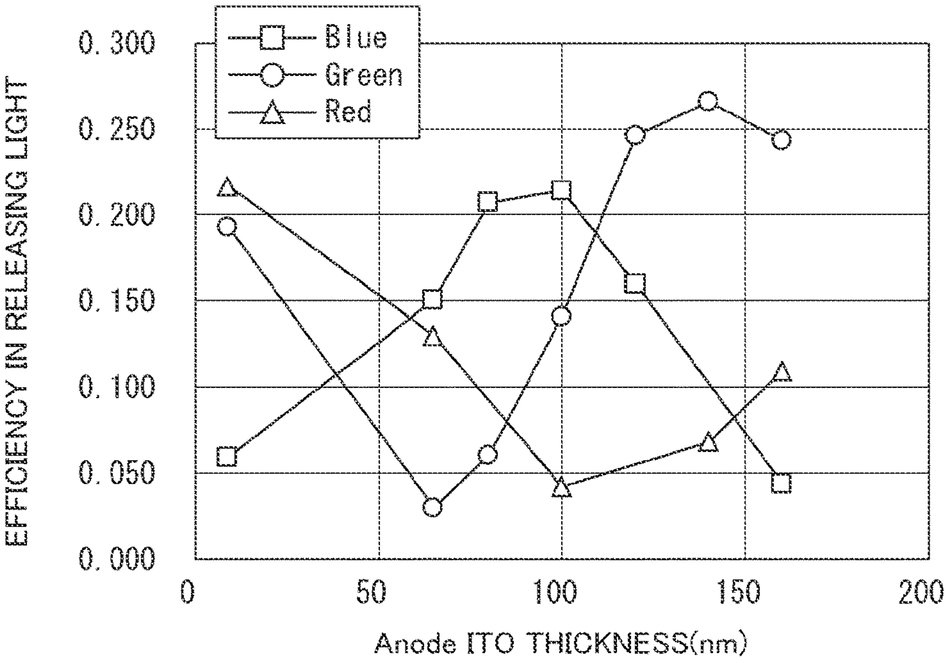
FIG. 9 is a graph illustrating a relationship between a thickness of a light-transparent conductive layer of the anode electrode in the light-emitting structure and efficiency in releasing light from the light-emitting structure.

FIG. 8 illustrates a conceptual diagram illustrating the TFT substrate 2, the anode electrode 3, the EL layer 5, and the cathode electrode 6 in a light-emitting structure 101. FIG. 9 is a graph illustrating a relationship between a thickness (the horizontal axis: all dimensions in mm) of the light-transparent conductive layer 12 of the anode electrode 3 in the light-emitting structure 101 and efficiency (the vertical axis: all dimensions in any given unit) in releasing light from the light-emitting structure 101.

On the TFT substrate 2, the anode electrode 3 is provided. The anode electrode 3 is driven by a TFT of the TFT substrate 2. On the anode electrode 3, a hole injection layer 41, a hole transport layer 42, an electroluminescence layer 43, and an electron transport layer 44 are stacked on top of another in the stated order. The hole injection layer 41, the hole transport layer 42, the electroluminescence layer 43, and the electron transport layer 44 constitute the EL layer 5. On the EL layer 5, the cathode electrode 6 is provided. Between the electron transport layer 44 and the cathode electrode 6, an electron injection layer may be provided.

Light emitted from the electroluminescence layer 43 includes: light that is not reflected on, for example, the anode electrode 3, passes through the cathode electrode 6, and travels out of the light-emitting structure 101; and light that is reflected on, for example, the anode electrode 3, then passes through the cathode electrode 6, and travels out of the light-emitting structure 101. Hence, depending on a thickness of the light-emitting layer 26 (see, for example, FIG. 4) including the electroluminescence layer 43, results may vary as to how the light emitted from the electroluminescence layer 43 is released. The light-emitting structure 101 takes advantage of the microcavity structure to increase an amount of light emitted from the light-emitting structure 101 upwards, and maximize the amount of light, emitted from the light-emitting structure 101, with respect to the current flowing between the anode electrode 3 and the cathode electrode 6.

In FIG. 9. "Blue", "Green", and "Red" correspond to efficiencies in releasing light from the respective light-emitting structures 101B, 101G, and 101R (see, for example, FIG. 6). FIG. 9 shows that, the light-transparent conductive layers 12 in the respective light-emitting structures 101B, 101G, and 101R have different thicknesses for the highest efficiency in releasing light. In each of the light-emitting structures 101B, 101G, and 101R, the hole injection layer 41 and the hole transport layer 42 also have different thicknesses for the highest efficiency in releasing light.

FIG. 9 shows an example of a case when the efficiency in releasing light is improved most only by optimizing the film thickness of each light-transparent conductive layer 12. If the film thickness of the light-transparent conductive layer 12 is changed for each of the light-emitting structure 101R, the light-emitting structure 101G, and the light-emitting structure 101B by the known sputtering film deposition and by patterning using photolithography, the process becomes redundant, which is not desirable from the viewpoint of manufacturing costs. In the present application, an arrangement of the light-emitting structures 101R, the light-emitting structures 101G, and the light-emitting structures 101B is utilized to successfully change, in a single process, the film thicknesses of the light-transparent conductive layers 12 for the light-emitting structures 101R, the light-emitting structures 101G, and the light-emitting structures 101B.

Since the optimum film thickness depends on a wavelength, the light-transparent conductive layers 12 of the light-emitting structures 101R are designed to be thickest. On an assumption that the light-emitting structures are formed of multilayer films in which each of a coating film has an industrially realistic thickness of approximately 10 nm or more, the light-emitting structures can be designed so that an optical path length of each light-emitting structure 101R is shorter by one wavelength than an optical path length of each of the light-emitting structures 101G and 101B. This design is common to all the embodiments. In a case of the second embodiment, the light-emitting structures 101R, the light-emitting structures 101B, and the light-emitting structures 101G may be arranged in the order from inside.

Figure 10:
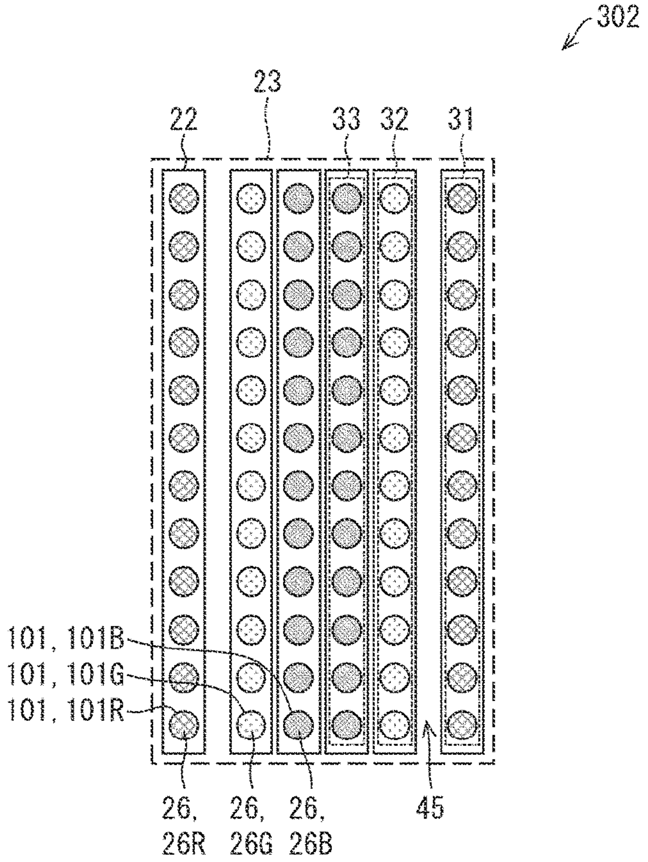
FIG. 10 illustrates a schematic plan view of how a plurality of light-emitting structures are arranged in a display device according to a second embodiment of the disclosure.

FIG. 10 illustrates a schematic plan view of how the plurality of light-emitting structures 101 are arranged in a display device 302 according to the second embodiment of the disclosure. FIG. 10 also shows a position of the electrode 22.

In the display device 302, the plurality of light-emitting layers 26 in the pixel 23 include the red light-emitting layers 26R, the green light-emitting layers 26G, and blue light-emitting layers 26B. The plurality of light-emitting layers 26 are arranged in a matrix. The bank 4 includes a second clearance portion 45 that separates adjacent two of the columns in the matrix from each other. Here, the second clearance portion 45 separates the columns 31 and 32 from each other. Among the plurality of light-emitting layers 26, either red light-emitting layers 26R (to the column 31) or green light-emitting layers 26G (to the column 32) are adjacent to the second clearance portion 45.

Except for the features described above, the pixel 23 of the display device 302 illustrated in FIG. 10 is the same in configuration as the pixel 23 of the display device 301 illustrated in FIG. 7.

Note that, as the display device 301 illustrated in FIG. 7, the display device 302 may include: the pixel 24; and the first clearance portion 40 formed to separate the pixel 23 and the pixel 24 from each other. Among the plurality of light-emitting layers 26, red light-emitting layers 26R may be adjacent to the first clearance portion 40.

Third Embodiment

Figure 11:
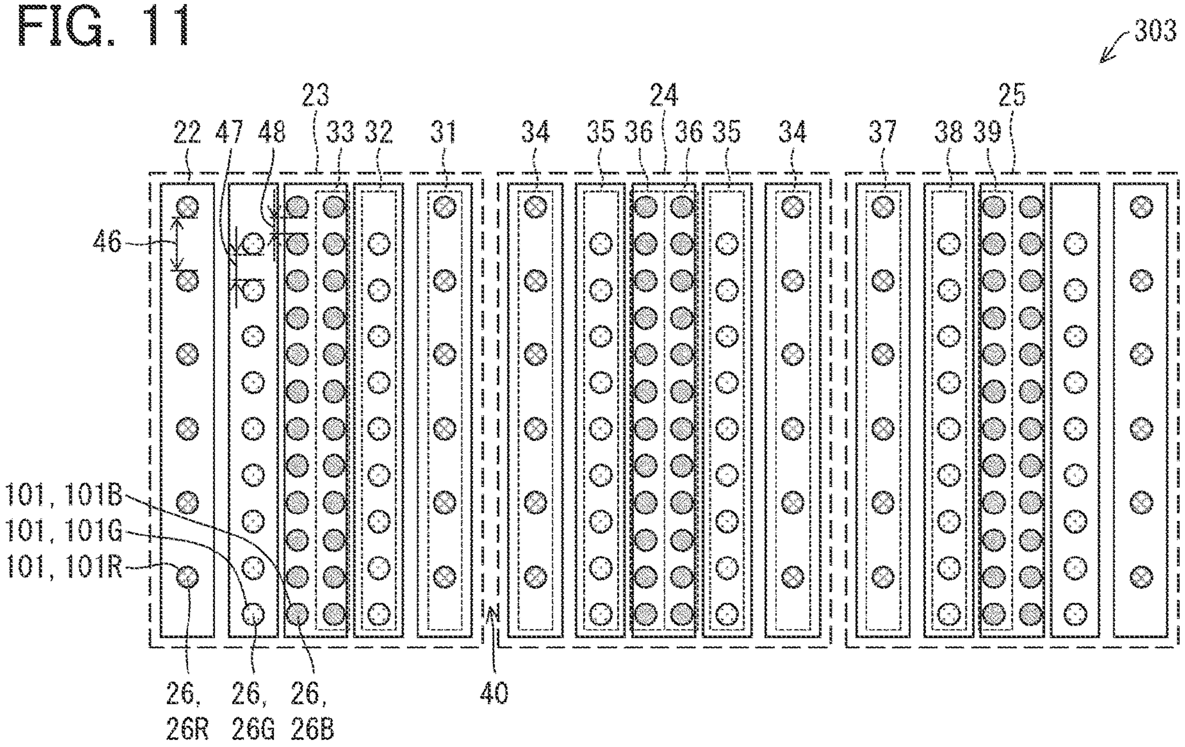
FIG. 11 illustrates a schematic plan view of how a plurality of light-emitting structures are arranged in a display device according to a third embodiment of the p disclosure.

FIG. 11 illustrates a schematic plan view of how the plurality of light-emitting structures 101 are arranged in a display device 303 according to a third embodiment of the present invention. FIG. 11 also shows a position of the electrode 22.

In the display device 303, the plurality of red light-emitting layers 26R, green light-emitting layers 26G, and blue light-emitting layers 26B are arranged in columns in the form of the columns 31 to 39.

A clearance 46 between adjacent two of the plurality of red light-emitting layers 26R that belong to the same column (e.g., the column 31) is larger than a clearance 47 between adjacent two of the plurality of green light-emitting layers 26G that belong to the same column (e.g. the column 32). The clearance 47 is larger than a clearance 48 between adjacent two of the plurality of blue light-emitting layers 26B that belong to the same column (e.g., the column 33). Note that a clearance between the two light-emitting layers 26 corresponds to a length of a line segment connecting the two light-emitting layers 26 in the shortest distance.

The display device 303 can easily adjust white balance using the same drive voltage, by changing the number of the red light-emitting layers 26R, the green light-emitting layers 26G, and the blue light-emitting layers 26B.

Furthermore, the display device 301 has individual electrodes 22 provided for the two adjacent columns 36 of the pixels 24; whereas, the display device 303 has the electrode 22 provided in common to two adjacent columns 36 of the pixels 24.

Except for the features described above, the display device 303 illustrated in FIG. 11 is the same in configuration as the display device 301 illustrated in FIG. 7.

Note that, as the display device 302 illustrated in FIG. 10, the display device 303 may include the second clearance portion 45 formed to separate the column 31 and the column 32 from each other. Among the plurality of light-emitting layers 26, either red light-emitting layers 26R or green light-emitting layers 26G may be adjacent to the second clearance portion 45.

Fourth Embodiment

Figure 12:
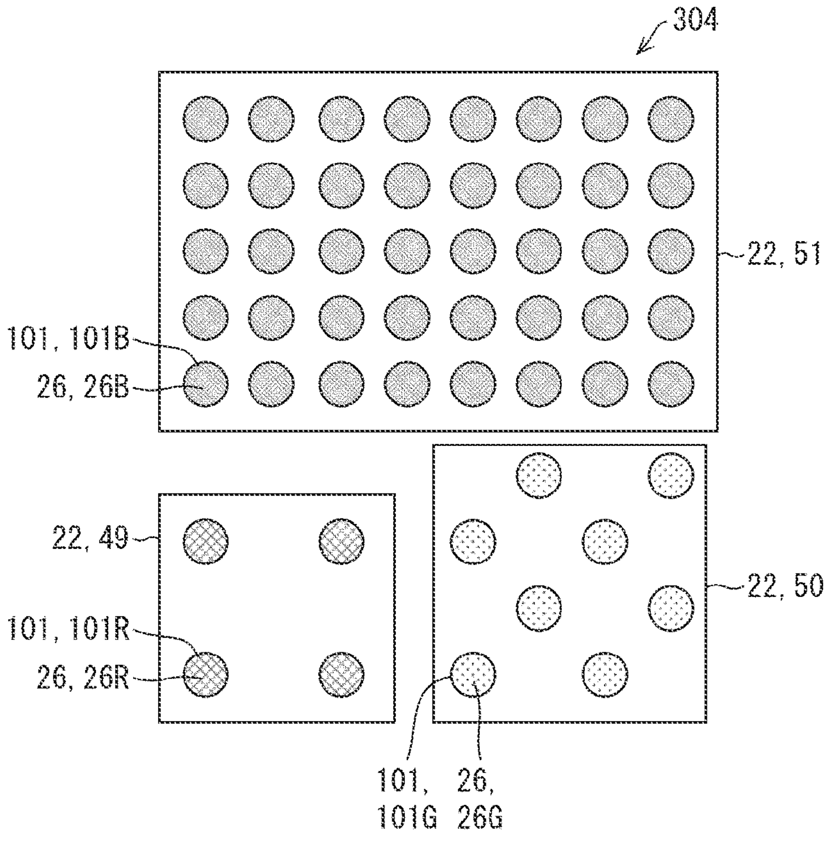
FIG. 12 illustrates a schematic plan view of how a plurality of light-emitting structures are arranged in a display device according to a fourth embodiment of the disclosure.

FIG. 12 illustrates a schematic plan view of how the plurality of light-emitting structures 101 are arranged in a display device 304 according to a fourth embodiment of the disclosure. FIG. 12 also shows a position of the electrode 22.

In the display device 304, the plurality of light-emitting layers 26 include: the plurality of red light-emitting layers 26R arranged in a first region 49; the plurality of green light-emitting layers 26G arranged in a second region 50; and the plurality of blue light-emitting layers 26B arranged in a third region 51. The first region 49, the second region 50, and the third region 51 are different regions from one another.

The plurality of red light-emitting layers 26R in the first region 49 are lower in density than the plurality of green light-emitting layers 26G in the second region 50. The plurality of green light-emitting layers 26G in the second region 50 are lower in density than the plurality of blue light-emitting layers 26B in the third region 51.

In each of the display devices 301 to 303, the red light-emitting layers 26R, the green light-emitting layers 26G, and the blue light-emitting layers 26B are arranged in stripes. In this case, when the electroluminescence layers 43 (see FIG. 8) are patterned by photolithography, the patterned width has to be controlled approximately by the order of the diameter of the holes 1. Such control is of a concern to lead to a possible reduction in yield.

As to the display device 304, the electroluminescence layers 43 can be patterned to have a width sufficiently larger than the diameter of the holes 1. Such a feature contributes to an improvement in yield. Furthermore, the display device 304 can achieve higher resolution.

In addition, the display device 304 has the electrode 22 for each of the first region 49, the second region 50, and the third region 51.

Method for Manufacturing Display Device

A method for manufacturing each of the display devices 301 to 304 is also included in the scope of the disclosure.

That is, the method for manufacturing a display device includes: a first step of forming the bank 4 in which the plurality of holes 1 are formed; and a second step of forming the plurality of light-emitting layers 26 in the plurality of holes 1 by coating. At the second step, a light-emitting layer 26, which is provided closer to a position in which the plurality of holes 1 are lower in density, exhibits a greater emission wavelength. Such a method is also included in the scope of the disclosure.

Summary

A display device according to a first aspect of the disclosure includes: a bank in which a plurality of holes are formed; and a plurality of light-emitting layers formed in the plurality of holes. Among the plurality of light-emitting layers, a light-emitting layer, which is provided closer to a position in which the plurality of holes are low in density, exhibits a greater emission wavelength.

Thanks to the above features, a light-emitting layer having a greater emission wavelength tends to be formed thicker, and each light-emitting layer can easily and sufficiently obtain the microcavity effect. Such a feature allows the display device to have the light-emitting layers with high light-emission efficiency.

As to the display device, of a second aspect of the disclosure, according to the first aspect, the plurality of light-emitting layers include: a red light-emitting layer that emits a red light; a green light-emitting layer that emits a green light; and a blue light-emitting layer that emits a blue light. The plurality of light-emitting layers are divided into a plurality of groups. The bank includes a first clearance portion separating adjacent two of the plurality of groups from each other. Among the plurality of light-emitting layers, the red light-emitting layer is adjacent to the first clearance portion.

As to the display device, of a third aspect of the disclosure, according to the first or second aspect, the plurality of light-emitting layers include: a red light-emitting layer that emits a red light; a green light-emitting layer that emits a green light; and a blue light-emitting layer that emits a blue light. The plurality of light-emitting layers are arranged in a matrix. The bank includes a second clearance portion separating two adjacent columns in the matrix from each other. Among the plurality of light-emitting layers, either the red light-emitting layer or the green light-emitting layer is adjacent to the second clearance portion.

As to the display device, of a fourth aspect of the disclosure, according to any one of the first to third aspects, the plurality of light-emitting layers include: a red light-emitting layer that emits a red light; a green light-emitting layer that emits a green light; and a blue light-emitting layer that emits a blue light. A plurality of the red light-emitting layers, a plurality of the green light-emitting layers, and a plurality of the blue light-emitting layers are arranged in a form of columns. A clearance between adjacent two of the plurality of red light-emitting layers that belong to a same column is larger than a clearance between adjacent two of the plurality of green light-emitting layers that belong to a same column. The clearance between adjacent two of the plurality of green light-emitting layers that belong to the same column is larger than a clearance between adjacent two of the plurality of blue light-emitting layers that belong to a same column.

As to the display device, of a fifth aspect of the disclosure, according to any one of the second to fourth aspects, any one of the red light-emitting layer, the green light-emitting layer, or the blue light-emitting layer is a marked light-emitting layer. A plurality of the marked light-emitting layers are arranged in a form of columns. The display device includes an electrode common to the plurality of marked light-emitting layers that belong to a same column.

As to the display device, of a sixth aspect of the disclosure, according to the first aspect, the plurality of light-emitting layers include: a plurality of red light-emitting layers arranged in a first region, and each emitting a red light; a plurality of green light-emitting layers arranged in a second region different from the first region, and each emitting a green light; and a plurality of blue light-emitting layers arranged in a third region different from the first region and the second region, and each emitting a blue light. The plurality of red light-emitting layers in the first region are lower in density than the plurality of green light-emitting layers in the second region. The plurality of green light-emitting layers in the second region are lower in density than the plurality of blue light-emitting layers in the third region.

A method for method for manufacturing a display device according to a seventh aspect of the disclosure includes: a first step of forming a bank in which a plurality of holes are formed; and a second step of forming a plurality of light-emitting layers in the plurality of holes by coating. At the second step, a light-emitting layer, which is provided closer to a position in which the plurality of holes are lower in density, exhibits a greater emission wavelength.

The above features contribute to manufacturing of the display device according to the first aspect of the disclosure.

The disclosure shall not be limited to the embodiments described above, and can be modified in various manners within the scope of claims. The technical aspects disclosed in different embodiments are to be appropriately combined together to implement another embodiment. Such an embodiment shall be included within the technical scope of the disclosure. Moreover, the technical aspects disclosed in each embodiment may be combined to achieve a new technical feature.

The invention claimed is:

1. A display device, comprising:
a bank in which a plurality of holes is formed; and
a plurality of light-emitting layers formed in the plurality of holes,
wherein:
the plurality of light-emitting layers forms a plurality of pixel regions, each pixel region comprising a plurality of red light-emitting layers configured to emit red light, a plurality of green light-emitting layers configured to emit green light, and a plurality of blue light-emitting layers configured to emit blue light,
the bank includes a first clearance portion separating adjacent pixel regions of the plurality of pixel regions, and
the plurality of red light-emitting layers is arranged closest to the first clearance portion, and the plurality of blue light-emitting layers is arranged farthest from the first clearance portion.

2. The display device according to claim 1,
wherein, within each of the plurality of pixel regions, the plurality of red light-emitting layers is driven by a common first electrode, the plurality of green light-emitting layers is driven by a common second electrode, and the plurality of blue light-emitting layers is driven by a common third electrode.

3. The display device according to claim 1,
wherein each of the plurality of pixel regions includes:
a first region in which the plurality of red light-emitting layers is arranged;
a second region in which the plurality of green light-emitting layers is arranged; and
a third region in which the plurality of blue light-emitting layers is arranged,
the plurality of red light-emitting layers in the first region is lower in density than the plurality of green light-emitting layers in the second region, and
the plurality of green light-emitting layers in the second region is lower in density than the plurality of blue light-emitting layers in the third region.

* * * * *